United States Patent
Li

(10) Patent No.: US 11,616,437 B2
(45) Date of Patent: Mar. 28, 2023

(54) CONSTANT POWER CONTROL CIRCUIT AND VOLTAGE GENERATOR CIRCUIT THEREOF

(71) Applicant: Nuvoton Technology Corporation, Hsinchu Science Park (TW)

(72) Inventor: Cheng-Tao Li, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 157 days.

(21) Appl. No.: 17/173,548

(22) Filed: Feb. 11, 2021

(65) Prior Publication Data

US 2021/0408905 A1 Dec. 30, 2021

(30) Foreign Application Priority Data

Jun. 29, 2020 (TW) .................................. 109121772

(51) Int. Cl.
*H02M 3/156* (2006.01)
*H03K 19/20* (2006.01)
*H02M 1/44* (2007.01)

(52) U.S. Cl.
CPC ............. *H02M 3/156* (2013.01); *H02M 1/44* (2013.01); *H03K 19/20* (2013.01)

(58) Field of Classification Search
None
See application file for complete search history.

(56) References Cited

U.S. PATENT DOCUMENTS 7,598,718 B2 * 10/2009 Lipcsei ............... H02M 3/1588
323/284
8,089,743 B2 1/2012 Jian
(Continued)

FOREIGN PATENT DOCUMENTS

| CN | 102541141 B | 7/2015 |
|---|---|---|
| TW | M363021 U1 | 8/2009 |
| TW | 201015263 A | 4/2010 |

OTHER PUBLICATIONS

Search Report dated Feb. 5, 2021 issued in corresponding Taiwan Application No. 109121772.
(Continued)

*Primary Examiner* — Jeffrey A Gblende
(74) *Attorney, Agent, or Firm* — Muncy, Geissler, Olds & Lowe, P.C.

(57) ABSTRACT

A constant power control circuit driving an external device receiving an input voltage and generating an output voltage is provided. A first conversion circuit converts the voltage difference between the input voltage and the output voltage to generate a charge current. An energy storage circuit is charged during a charging period by the charge current to provide a stored voltage. The charging period is terminated in response to the stored voltage reaching a predetermined voltage. A control circuit adjusts a control signal according to a length of the charging period. A second conversion circuit generates a counting voltage according to the control signal. The counting voltage is inversely proportional to the voltage difference. A third conversion circuit converts the counting voltage into a limitation current. A driving circuit compares the setting current and the limitation current to generate a driving signal and send it to the external device.

19 Claims, 4 Drawing Sheets

(56) References Cited

U.S. PATENT DOCUMENTS

| | | | |
|---|---|---|---|
| 9,343,969 B2* | 5/2016 | Yanagida | H02M 3/1588 |
| 9,766,642 B2 | 9/2017 | Pons | |
| 10,348,198 B2* | 7/2019 | Ongaro | H02M 3/156 |
| 2007/0210726 A1 | 9/2007 | Illegems | |
| 2012/0206110 A1* | 8/2012 | Nishida | H02J 7/0034 |
| | | | 323/265 |
| 2015/0346747 A1* | 12/2015 | Park | H05B 45/375 |
| | | | 323/281 |
| 2017/0213510 A1* | 7/2017 | Takenaka | H02M 3/156 |

OTHER PUBLICATIONS

Office Action dated Feb. 8, 2021 issued in corresponding Taiwan Application No. 109121772.

\* cited by examiner

CONSTANT POWER CONTROL CIRCUIT AND VOLTAGE GENERATOR CIRCUIT THEREOF

CROSS REFERENCE TO RELATED APPLICATIONS

This application claims priority of Taiwan Patent Application No. 109121772, filed on Jun. 29, 2020, the entirety of which is incorporated by reference herein.

BACKGROUND OF THE INVENTION

Field of the Invention

The invention relates to a constant power control circuit, and more particularly to a constant power control circuit that generates a limitation current according to the voltage difference between an input voltage and an output voltage.

Description of the Related Art

Generally, high-voltage power switching devices may receive an input voltage and provide an output voltage to a load. When the operation of the load is abnormal, the output voltage generated by the high-voltage power switching device may be dropped. Since the voltage difference between the input voltage and the dropped output voltage is increased, the current passing through the high-voltage power switching device is increased. Therefore, the power of the high-voltage power switching device increases so that the high-voltage power switching device cannot work in a safe operating area.

BRIEF SUMMARY OF THE INVENTION

In accordance with an embodiment of the disclosure, a constant power control circuit drives an external device. The external device receives an input voltage and generates an output voltage. The constant power control circuit comprises a voltage generator circuit and a driving circuit. The voltage generator circuit generates a limitation current according to the voltage difference between the input voltage and the output voltage and comprises a first conversion circuit, an energy storage circuit, a control circuit, a second conversion circuit, and a third conversion circuit. The first conversion circuit converts the voltage difference to generate a charge current. The energy storage circuit is charged during a charging period by the charge current to provide a stored voltage. The charging period is terminated in response to the stored voltage reaching a predetermined voltage. The control circuit generates a control signal. The control circuit adjusts a duty cycle of the control signal according to a length of the charging period. The second conversion circuit generates a counting voltage according to the control signal. The counting voltage is inversely proportional to the voltage difference. The third conversion circuit converts the counting voltage to generate the limitation current. The driving circuit compares a setting current and the limitation current to generate a driving signal and provides the driving signal to the external device. In response to the limitation current being greater than the setting current, the driving circuit generates the driving signal according to the setting current. In response to the limitation current being smaller than the setting current, the driving circuit generates the driving signal according to the limitation current.

In accordance with another embodiment of the disclosure, a voltage generator circuit comprises a first conversion circuit, an energy storage circuit, a control circuit, and a second conversion circuit. The first conversion circuit converts the voltage difference to generate a charge current. The energy storage circuit is charged during a charging period by the charge current to adjust a stored voltage. The charging period is terminated in response to the stored voltage reaching a predetermined voltage. The control circuit generates a control signal and adjusts a duty cycle of the control signal according to a length of the charging period. The second conversion circuit generates a counting voltage according to the control signal. The counting voltage is inversely proportional to the voltage difference.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
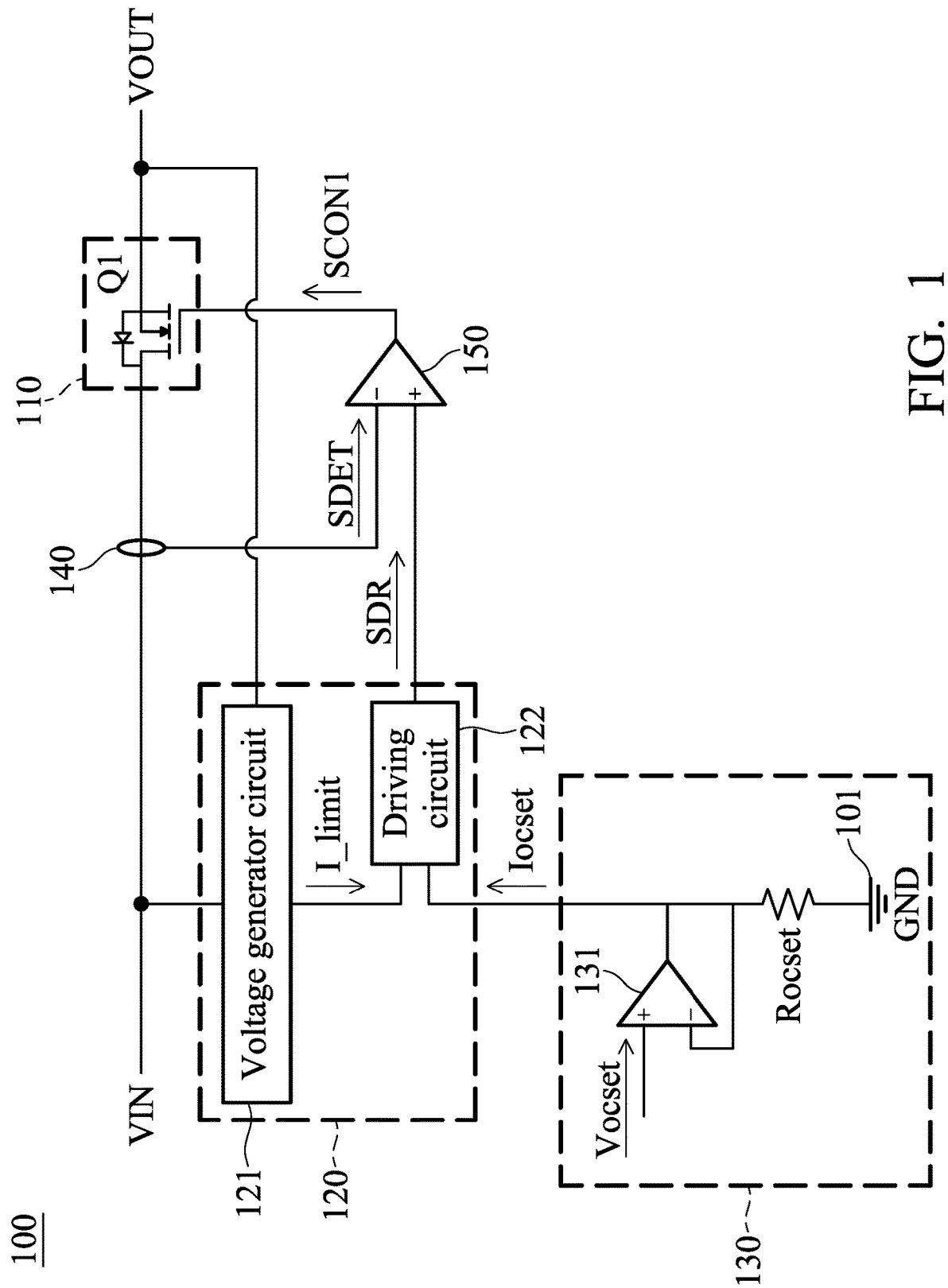
FIG. 1 is a schematic diagram of an exemplary embodiment of an operation system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation system, according to various aspects of the present disclosure. The operation system 100 comprises an external device 110 and a constant power control circuit 120. The external device 110 receives an input voltage VIN and generates an output voltage VOUT according to a control signal SCON1. In this embodiment, the constant power control circuit 120 is configured to control the power of the external device 110 to ensure that the external device 110 always operates in a safe operation area when the output voltage VOUT is changed.

The type of the external device 110 is not limited in the present disclosure. In this embodiment, the external device 110 is a high voltage power switch device which comprises a driving transistor Q1. The gate of the driving transistor Q1 receives the control signal SCON1. The drain (referred to as a first electrode) of the driving transistor Q1 receives the input voltage VIN. The source (referred to as a second electrode) of the driving transistor Q1 provides the output voltage VOUT. In one embodiment, the output voltage VOUT is provided to an external load (not shown). The external load receives the output voltage VOUT and operates according to the output voltage VOUT. In such cases, when the external load operates abnormally, the output voltage VOUT may be changed significantly. Therefore, the voltage difference between the output voltage VOUT and the input voltage VIN is increased so that the current passing through the driving transistor Q1 is increased significantly and the power of the driving transistor Q1 is increased significantly.

In this embodiment, the constant power control circuit 120 generates a limitation current I_limit according to the voltage difference (VIN−VOUT) between the input voltage VIN and the output voltage VOUT and compares the limitation current I_limit and a setting current Iocset to generate a driving signal SDR. In one embodiment, the driving signal SDR serves as the control signal SCON1. The structure of the constant power control circuit 120 is not limited in the present disclosure. In one embodiment, the constant power control circuit 120 may be an analog circuit. In such cases, the constant power control circuit 120 comprises a voltage generator circuit 121 and a driving circuit 122.

The voltage generator circuit 121 generates a reciprocal $$\left(\frac{K}{VIN-VOUT}\right)$$

of the voltage difference (VIN−VOUT) according to the voltage difference (VIN−VOUT) between the input voltage VIN and the output voltage VOUT, wherein the symbol K is a parameter of the element in the voltage generator circuit 121. In such cases, the voltage generator circuit 121 generates a limitation current I_limit according to the reciprocal $$\left(\frac{K}{VIN-VOUT}\right).$$

In this embodiment, the voltage difference (VIN−VOUT) is inversely proportional to the limitation current I_limit. In other words, when the voltage difference (VIN−VOUT) is increased, the limitation current I_limit is reduced. When the voltage difference (VIN−VOUT) is reduced, the limitation current I_limit is increased.

The driving circuit 122 compares the limitation current I_limit and the setting current Iocset and generates the driving signal SDR. In one embodiment, when the limitation current I_limit is greater than the setting current Iocset, the driving circuit 122 generates the driving signal SDR according to the setting current Iocset. However, when the limitation current I_limit is less than the setting current Iocset, the driving circuit 122 generates the driving signal SDR according to the limitation current I_limit. Since the driving circuit 122 generates the driving signal SDR according to the small current, the external device 110 does not exit the safe operating area (SOA) when the output voltage VOUT is changed significantly.

In other embodiments, the operation system 100 further comprises a setting circuit 130. The setting circuit 1330 is configured to generate the setting current Iocset. The structure of the setting circuit 130 is not limited in the present disclosure. In one embodiment, the setting circuit 130 comprises an operational amplifier 131 and a resistor Rocset. The non-inverting input terminal of the operational amplifier 131 receives a setting voltage Vocset. In one embodiment, the setting voltage Vocset can be defined by the user.

The setting voltage Vocset usually indicates the maximum voltage that the external device 110 can withstand. Therefore, the setting voltage Vocset can be referred to as an over voltage set. Additionally, the setting current Iocset usually indicates the maximum current that the external device 110 can withstand. Therefore, the setting current Iocset is referred to as an over current set.

The resistor Rocset is coupled between the inverting input terminal of the operational amplifier 131 and a ground node 101. The ground node 101 receives a ground voltage GND. In such cases, the current passing through the resistor Rocset serves as the setting current Iocset. In some embodiments, the user may adjust the resistance of the resistor Rocset to change the setting current Iocset. In such cases, when the setting voltage Vocset is maintained, if the resistance of the resistor Rocset is increased, the setting current Iocset is reduced. Alternatively, if the resistance of the resistor Rocset is reduced, the setting current Iocset is increased.

In other embodiments, the operation system 100 further comprises a detection circuit 140 and a comparator circuit 150. The detection circuit 140 is configured to detect the input current of the external device 110 to generate a detection result. The detection circuit 140 generates a detection signal SDET according to the detection result. The structure of the detection circuit 140 is not limited in the present disclosure. In one embodiment, the detection circuit 140 is a current-to-voltage converter. In such cases, the detection signal SDET is a voltage signal.

The comparator circuit 150 generates the control signal SCON1 according to the detection signal SDET and the driving signal SDR. In one embodiment, when the detection signal SDET is less than the driving signal SDR, it means that the current passing through the external device 110 is normal. Therefore, the control signal SCON1 is at a first level. When the detection signal SDET is higher than the driving signal SDR, it means that the input current of the external device 110 is abnormal because the output voltage VOUT is changed significantly. Therefore, the control signal SCON1 is at a second level. In such cases, the external device 110 determines the current passing through itself based on the level of the control signal SCON1. For example, with an increase in the level of the control signal SCON1, the external device 110 allows a larger current to pass through itself. Conversely, with a decrease in the level of the control signal SCON1, the external device 110 allows a smaller current to pass through itself. Since the control signal SCON1 limits the current passing through the external device 110, the power of the external device 110 can be controlled so that the external device 110 operates in the safe operating area.

Figure 2A:
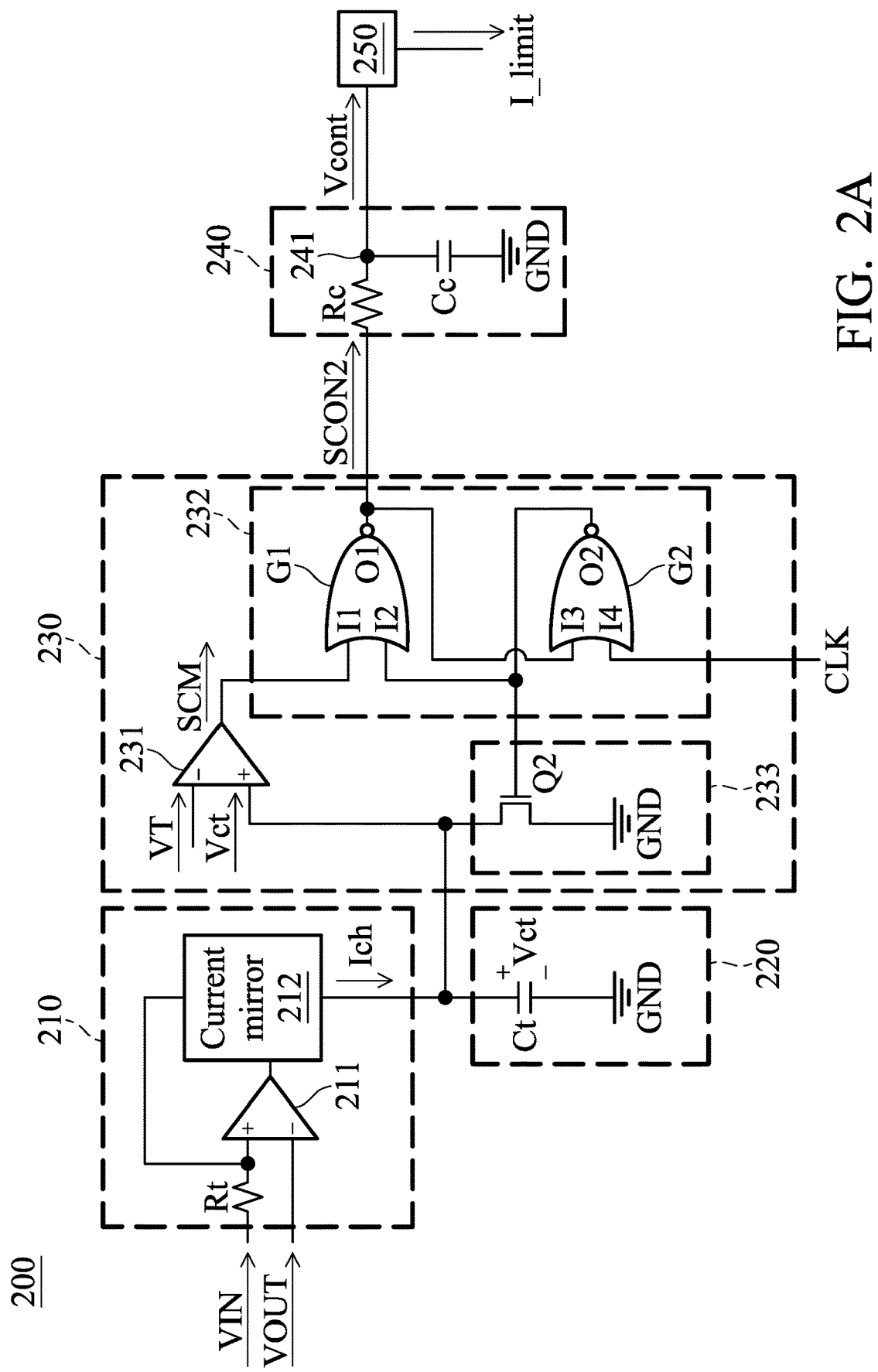
FIG. 2A is a schematic diagram of an exemplary embodiment of a voltage generator circuit, according to various aspects of the present disclosure.

FIG. 2A is a schematic diagram of an exemplary embodiment of a voltage generator circuit, according to various aspects of the present disclosure. The voltage generator circuit 200 comprises conversion circuits 210 and 240, an energy storage circuit 220, and a control circuit 230. The conversion circuit 210 converts the voltage difference (VIN−VOUT) between the input voltage VIN and the output voltage VOUT to generate a charge current Ich. The structure of the conversion circuit 210 is not limited in the present disclosure. In one embodiment, the conversion circuit 210 is a voltage-to-current converter.

In this embodiment, the conversion circuit 210 comprises a comparator 211, a current mirror 212, and a resistor Rt. One terminal of the resistor Rt receives the input voltage VIN. The other terminal of the resistor Rt is coupled to the non-inverting input terminal of the comparator 211. The inverting input terminal of the comparator 211 receives the output voltage VOUT. The current mirror 212 generates the charge current Ich according to the current passing through the resistor Rt. In this embodiment, when the voltage difference between the input voltage VIN and the output voltage VOUT is increased, the charge current Ich is increased. In some embodiments, the charge current Ich is equal to the current passing through the resistor Rt.

The energy storage circuit 220 is charged by the charge current Ich to adjust a stored voltage Vct. In this embodiment, the energy storage circuit 220 is a capacitor Ct. The capacitor Ct is charged by the charge current Ich. In such cases, the voltage stored in the capacitor Ct is provided as the stored voltage Vct. As shown in FIG. 2A, one terminal of the capacitor Ct receives the charge current Ich, and the other terminal of the capacitor Ct receives the ground voltage GND.

When the charge current Ich increases, the stored voltage Vct reaches a predetermined voltage VT soon. When the charge current Ich reduces, the stored voltage Vct reaches the predetermined VT more slowly. Therefore, the change of the voltage difference (VIN–VOUT) can be obtained according to the length of a charging period, wherein the energy storage circuit 220 is charged during the charging period, and when the stored voltage Vct reaches the predetermined voltage VT, the charging period is terminated.

The control circuit 230 generates a control signal SCON2 and adjusts the duty cycle of the control signal SCON2 according to the length of the charging period. During the charging period, the energy storage circuit 220 is charged. When the stored voltage Vct reaches the predetermined voltage VT, the charging period is terminated. In this embodiment, when the length of the charging period is short, the width of the pulse of the control signal SCON2 is short. When the length of the charging period is long, the width of the pulse of the control signal SCON2 is long. Therefore, the width of the pulse of the control signal SCON2 is proportional to the length of the charging period and is inversely proportional to the voltage difference (VIN–VOUT). In other words, when the voltage difference (VIN–VOUT) between the output voltage VOUT and the input voltage VIN is increased, the width of the pulse of the control signal SCON2 is short. When the voltage difference (VIN–VOUT) is reduced, the width of the pulse of the control signal SCON2 is long. In such cases, the pulse of the control signal SCON2 is a positive pulse.

In one embodiment the control circuit 230 comprises a comparator 231 and a discharge circuit 232. The comparator 231 compares the stored voltage Vct and the predetermined voltage VT to generate a compared signal SCM. In this embodiment, the inverting input terminal of the comparator 231 receives the predetermined voltage VT. The non-inverting input terminal of the comparator 231 receives the stored voltage Vct. The output terminal of the comparator 231 provides the compared signal SCM.

The discharge circuit 232 generates the control signal SCON2 according to the compared signal SCM and a reset signal CLK. In one embodiment, when the reset signal CLK is asserted (e.g., at a high level), the discharge circuit 232 resets the energy storage circuit 220 so that the stored voltage Vct is equal to an initial value (e.g., 0V). In such cases, when the energy storage circuit 220 receives the charge current Ich, the stored voltage Vct is increased from the initial value (e.g., 0V). When the stored voltage Vct reaches the predetermined voltage VT, the discharge circuit 232 resets the energy storage circuit 220 again so that the stored voltage Vct returns to the initial value until the energy storage circuit 220 receives the charge current Ich again.

In one embodiment, when the energy storage circuit 220 is charged by the charge current Ich, the control signal SCON2 is at a first level. When the energy storage circuit 220 is reset, the control signal SCON2 is at a second level. The first level is opposite to the second level. For example, when the first level is a high level, the second level is a low level. When the first level is a low level, the second level is the high level.

In one embodiment, the discharge circuit 232 comprises logic gates G1 and G2, and a discharge element 233. The logic gate G1 has input terminals I1 and I2, and an output terminal O1. The logic gate G2 has input terminals I3 and I4, and an output terminal O2. The input terminal I1 receives the compared signal SCM. The input terminal I2 is coupled to the gate of the transistor Q2 and the output terminal O2. The output terminal O1 outputs the control signal SCON2 and is coupled to the input terminal I3. The input terminal I4 receives the reset signal CLK. In this embodiment, the logic gates G1 and G2 are NOR gates.

The discharge element 233 discharges the stored voltage Vct stored in the energy storage circuit 220 to an initial value according to the level of the output terminal O2. In this embodiment, the discharge element 233 is a transistor Q2. The gate of the transistor Q2 is coupled to the output terminal O2. The drain of the transistor Q2 is coupled to the energy storage circuit 220. The source of the transistor Q2 receives the ground voltage GND. When the level of the output terminal O2 is a high level, the transistor Q2 is turned on to set the stored voltage Vct to the ground voltage GND (referred to as an initial value). When the level of the output terminal O2 is a low level, the transistor Q2 is turned off. Therefore, the energy storage circuit 220 is charged by the charge current Ich.

The conversion circuit 240 generates a counting voltage Vcont according to the duty cycle of the control signal SCON2. Since the duty cycle of the control signal SCON2 is inversely proportional to the voltage difference (VIN–VOUT), the counting voltage is also inversely proportional to the voltage difference (VIN–VOUT). The structure of the conversion circuit 240 is not limited in the present disclosure. In one embodiment, the conversion circuit 240 is a filter circuit. In this embodiment, the conversion circuit 240 comprises a resistor Rc and a capacitor Cc. The resistor Rc is coupled between the output terminal O1 and the node 241. The one terminal of the capacitor Cc is coupled to the node 241. The other terminal of the capacitor Cc receives the ground voltage GND. In such cases, the voltage of the node 241 serves as the counting voltage Vcont.

In this embodiment, the voltage generator circuit 200 serves as an inverse voltage generator circuit. The counting voltage generated by the inverse voltage generator circuit is inversely proportional to the voltage difference (VIN–VOUT). Additionally, in FIG. 2, the resistance of the resistor Rt, the capacitance of the capacitor Ct, and the predetermined voltage VT affect the degree of inverse proportion. For example, a relationship between the counting voltage Vcont and the voltage difference (VIN–VOUT) can be expressed using the following equation:

$$Vcont \propto \frac{K}{VOUT - VIN}$$

wherein the symbol K relates to the resistance of the resistor Rt and the capacitance of the capacitor Cc.

The user can utilize the resistance of the resistor Rt and the capacitance of the capacitor Cc to control the degree of inverse proportion of the counting voltage Vcont and the voltage difference (VIN−VOUT).

The conversion circuit 251) converts the counting voltage Vcont to generate the limitation current I_limit. The structure of the conversion circuit 250 is not limited in the present disclosure. In one embodiment, the conversion circuit 250 is a voltage-to-current converter.

Figure 2B:
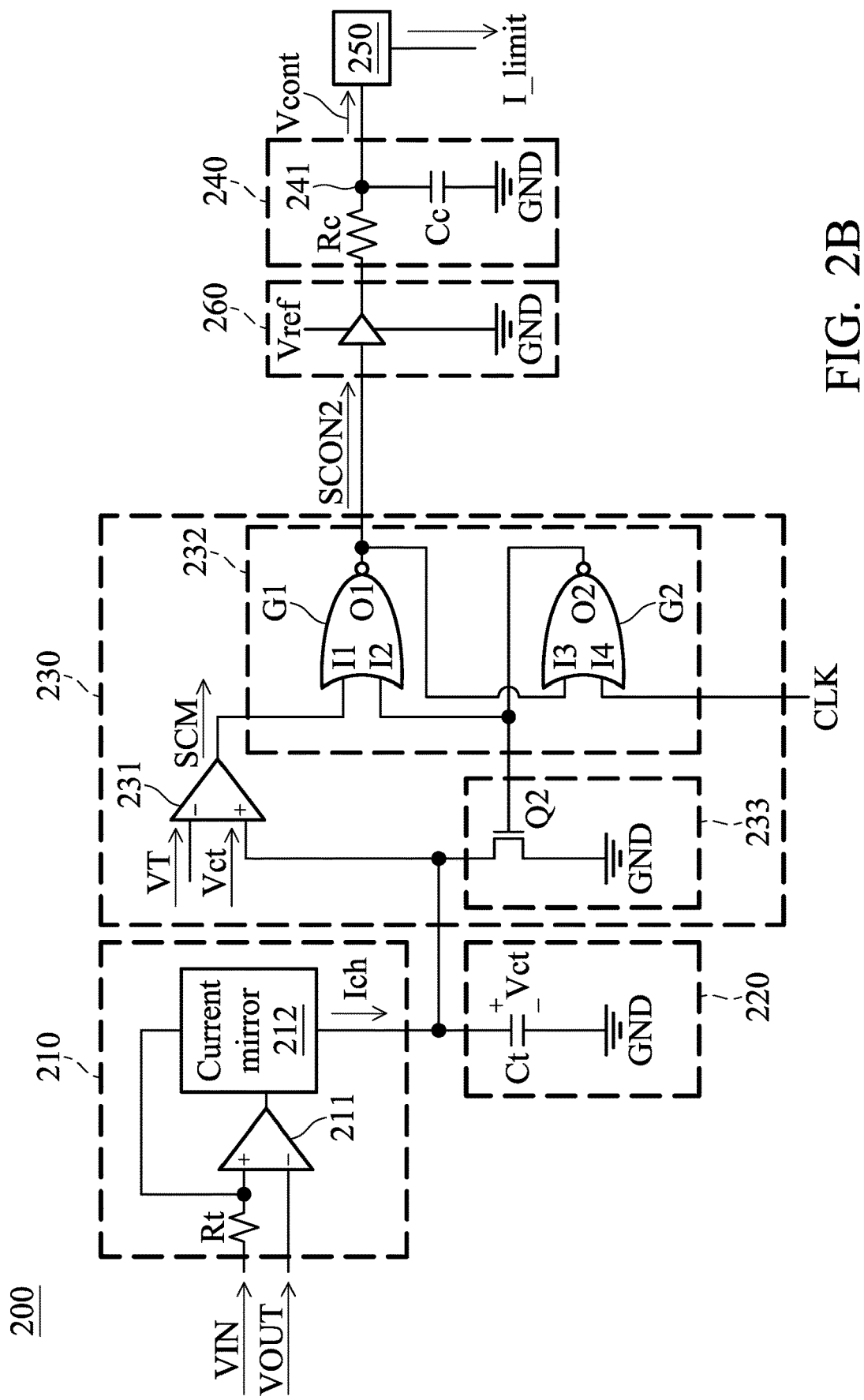
FIG. 2B is a schematic diagram of another exemplary embodiment of the voltage generator circuit, according to various aspects of the present disclosure.

FIG. 2B is a schematic diagram of another exemplary embodiment of the voltage generator circuit, according to various aspects of the present disclosure. FIG. 2A is similar to FIG. 2A except for the additional of a buffer 260. In this embodiment, the buffer 260 sets the level of the control signal SCON2 according to the reference voltage Vref and the ground voltage GND. In such cases, the maximum level of the control signal SCON2 is equal to the reference voltage Vref, and the minimum level of the control signal SCON2 is the ground voltage GND.

In such cases, the reference voltage Vref also affects the degree of inverse proportion of the counting voltage Vcont and the voltage difference (VIN−VOUT). For example, when the reference voltage Vref is increased, the degree of inverse proportion of the counting voltage Vcont and the voltage difference (VIN−VOUT) is increased. When the reference voltage Vref is reduced, the degree of inverse proportion of the counting voltage Vcont and the voltage difference (VIN−VOUT) is reduced. In other words, the reference voltage Vref is proportional to the counting voltage Vcont.

Figure 3:
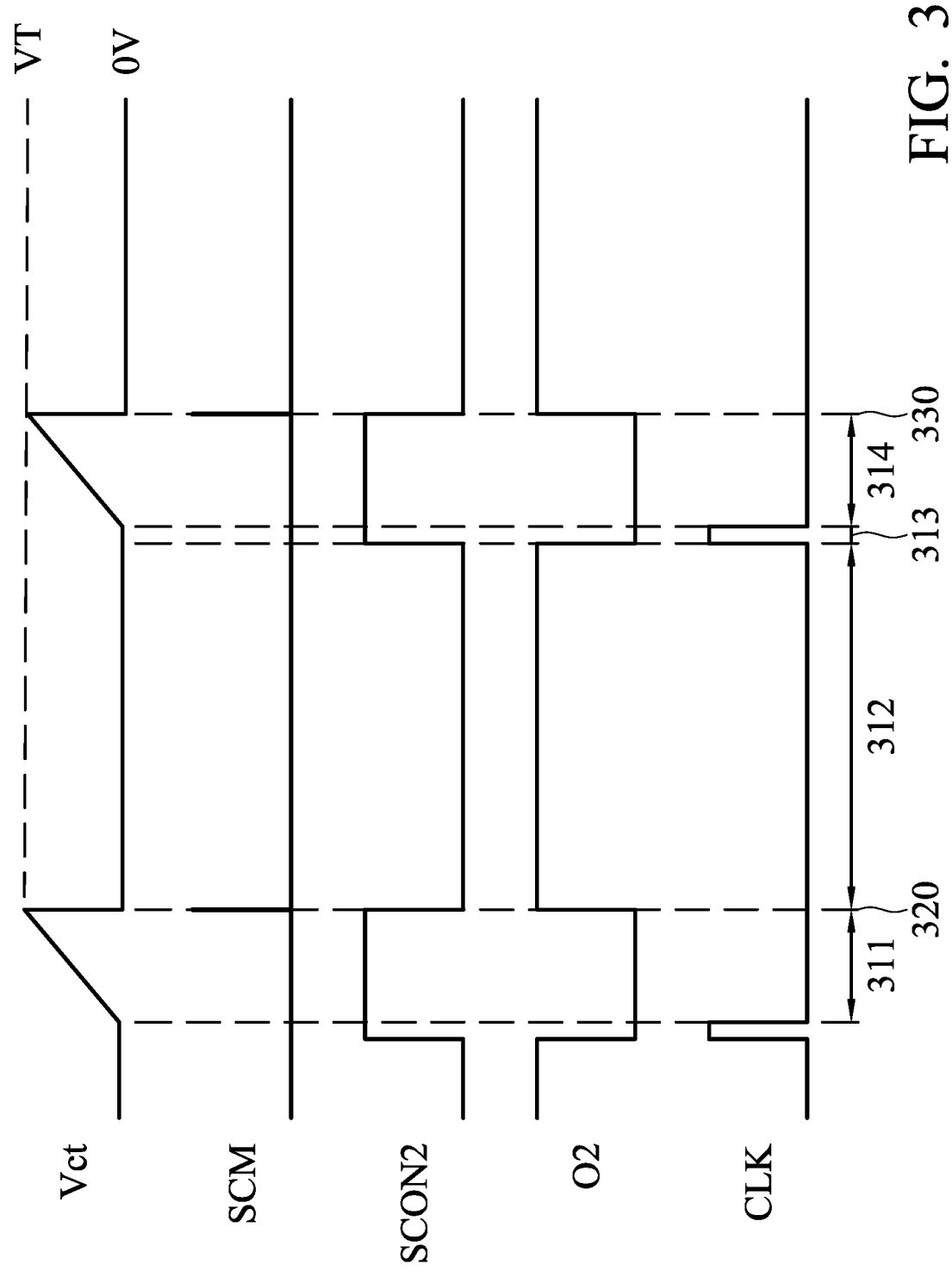
FIG. 3 is a control timing chart of an exemplary embodiment of a discharge circuit, according to various aspects of the present disclosure.

FIG. 3 is a control timing chart of an exemplary embodiment of a discharge circuit, according to various aspects of the present disclosure. Refer to FIG. 2A, since the energy storage circuit 220 receives the charge current Ich, the stored voltage Vct is increased during the period 311. In the time point 320, the stored voltage Vct reaches the predetermined voltage VT so that the compared signal SCM is changed from a low level to a high level. Therefore, the control signal SCON2 is at a low level. Since the reset signal CLK is also at a low level, the level of the output terminal O2 is a high level. Therefore, the transistor Q2 is turned on to discharge the stored voltage Vct to an initial value (e.g., 0V) during the period 312. In this embodiment, the period 311 is called the charging period of the energy storage circuit 220. When the voltage difference between the output voltage VOUT and the input voltage VIN is increased, the charge current Ich is large. Therefore, the length of the charging period (e.g., the period 311) of the energy storage circuit 220 is short. When the voltage difference between the output voltage VOUT and the input voltage VIN is reduced, the charge current Ich is small. Therefore, the length of the charging period (e.g., the period 311) of the energy storage circuit 220 is long.

During the period 313, the reset signal CLK is at a high level. Therefore, the output terminal O2 is at a low level to turn off the transistor Q2. At this period, since the stored voltage Vct does not reach the predetermined voltage VT, the compared signal SCM is at a low level. Therefore, the control signal SCON2 is at a high level. During the period 314, the reset signal CLK is at the low level. Since the control signal SCON2 is at the high level, the output terminal O2 is still at the low level to turn off the transistor Q2. During this period, when the energy storage circuit 220 receives the charge current Ich, the stored voltage Vct is increased.

In the time point 330, the stored voltage Vct reaches the predetermined voltage VT so that the compared signal SCM is changed from the low level to the high level. Therefore, the control signal SCON2 is at the low level. Since the reset signal CLK is also at the low level, the output terminal O2 is at the high level. Therefore, the stored voltage Vct is discharged to the initial value after the time point 330.

In this embodiment, the width of the pulse of the control signal SCON2 relates to the length of the charging period, and the length of the charging period relates to the charge current Ich. Since the charge current Ich relates to the voltage difference (VIN−VOUT), the width of the pulse of the control signal SCON2 relates to the voltage difference (VIN−VOUT). When the voltage difference (VIN−VOUT) is increased, the charge current Ich is increased so that the length of the charging period is reduced and the width of the pulse of the control signal SCON2 is reduced. Therefore, the width of the pulse of the control signal SCON2 is inversely proportional to the voltage difference (VIN−VOUT). In other words, when the voltage difference (VIN−VOUT) is increased, the width of the pulse of the control signal SCON2 is reduced. When the voltage difference (VIN−VOUT) is reduced, the width of the pulse of the control signal SCON2 is increased.

Since the counting voltage Vcont is inversely proportional to the voltage difference (VIN−VOUT), when the voltage difference (VIN−VOUT) is increased, the counting voltage Vcont is reduced. In FIG. 2A, when the counting voltage Vcont is reduced, the limitation current I_limit is reduced. Therefore, the external device does not exit the safe operating area when the output voltage VOUT is changed substantially.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A constant power control circuit for driving an external device, wherein the external device receives an input voltage and generates an output voltage, and the constant power control circuit comprises:
    a voltage generator circuit generating a limitation current according to a voltage difference between the input voltage and the output voltage and comprising:
    a first conversion circuit converting the voltage difference to generate a charge current;
    an energy storage circuit which is charged during a charging period by the charge current to provide a stored voltage, wherein the charging period is terminated in response to the stored voltage reaching a predetermined voltage;
a control circuit generating a control signal, wherein the control circuit adjusts a duty cycle of the control signal according to a length of the charging period;
a second conversion circuit generating a counting voltage according to the control signal, wherein the counting voltage is inversely proportional to the voltage difference; and
a third conversion circuit converting the counting voltage to generate the limitation current; and
a driving circuit comparing a setting current and the limitation current to generate a driving signal and providing the driving signal to the external device,
wherein:
in response to the limitation current being greater than the setting current, the driving current generates the driving signal according to the setting current, and
in response to the limitation current being smaller than the setting current, the driving circuit generates the driving signal according to the limitation current.

2. The constant power control circuit as claimed in claim 1, wherein the first conversion circuit comprises:
a first resistor comprising a first terminal and a second terminal, wherein the first terminal receives the input voltage;
a first comparator comprising a non-inverting input terminal and an inverting input terminal, wherein the non-inverting input terminal is coupled to the second terminal, and the inverting input terminal receives the output voltage; and
a current mirror generating the charge current according to a current passing through the first resistor.

3. The constant power control circuit as claimed in claim 2, wherein a relationship between the counting voltage and the voltage difference is expressed using the following equation:

$$Y \propto \frac{K}{X}$$

wherein Y is the counting voltage, X is the voltage difference, and K relates to the resistance of the first resistor.

4. The constant power control circuit as claimed in claim 1, wherein the control circuit comprises:
a second comparator comparing the stored voltage and the predetermined voltage to generate a compared signal; and
a discharge circuit resetting the energy storage circuit according to the compared signal,
wherein:
in response to the energy storage circuit receiving the charge current, the stored voltage is increased from an initial value, and
in response to the stored voltage reaching the predetermined voltage, the discharge circuit resets the energy storage circuit so that the stored voltage is equal to the initial value until the energy storage circuit receives the charge current.

5. The constant power control circuit as claimed in claim 4, wherein in response to the energy storage circuit being charged by the charge current, the discharge circuit sets the control signal to a first level, and in response to the energy storage circuit being reset, the discharge circuit sets the control signal to a second level which is opposite to the first level.

6. The constant power control circuit as claimed in claim 5, wherein the discharge circuit comprises:
a first logic gate comprising a first input terminal, a second input terminal, and a first output terminal, wherein the first input terminal receives the compared signal, and a level of the first output terminal serves as the control signal;
a second logic gate comprising a third input terminal, a fourth input terminal, and a second output terminal, wherein the third input terminal is coupled to the first output terminal, the fourth input terminal receives a reset signal, and the second output terminal is coupled to the second input terminal; and
a discharge element discharging the stored voltage according to a level of the second output terminal.

7. The constant power control circuit as claimed in claim 5, further comprising:
a buffer setting a level of the control signal according to a reference voltage.

8. The constant power control circuit as claimed in claim 7, wherein a relationship between the counting voltage and the voltage difference is expressed using the following equation:

$$Y \propto \frac{K}{X}$$

wherein Y is the counting voltage, X is the voltage difference, and K relates to the reference voltage.

9. The constant power control circuit as claimed in claim 1, wherein the second conversion circuit is a filter circuit.

10. The constant power control circuit as claimed in claim 1, wherein the energy storage circuit comprises a capacitor, a voltage of the capacitor serves as the stored voltage, and a relationship between the counting voltage and the voltage difference is expressed using the following equation:

$$Y \propto \frac{K}{X}$$

wherein Y is the counting voltage, X is the voltage difference, and K relates to the capacitance of the capacitor.

11. A voltage generator circuit comprising:
a first conversion circuit converting a voltage difference to generate a charge current;
an energy storage circuit which is charged during a charging period by the charge current to adjust a stored voltage, wherein the charging period is terminated in response to the stored voltage reaching a predetermined voltage;
a control circuit generating a control signal, wherein the control circuit adjusts a duty cycle of the control signal according to a length of the charging period; and
a second conversion circuit generating a counting voltage according to the control signal, wherein the counting voltage is inversely proportional to the voltage difference,
wherein the first conversion circuit comprises:

a first resistor comprising a first terminal and a second terminal, wherein the first terminal receives an input voltage;

a first comparator comprising a non-inverting input terminal and an inverting input terminal, wherein the non-inverting input terminal is coupled to the second terminal, and the inverting input terminal receives an output voltage; and a current mirror generating the charge current according to a current passing through the first resistor, and wherein the input voltage is provided to an external device, and the external device generates the output voltage.

12. The voltage generator circuit as claimed in claim 1, wherein a relationship between the counting voltage and the voltage difference is expressed using the following equation:

$$Y \propto \frac{K}{X}$$

wherein Y is the counting voltage, X is the voltage difference, and K relates to the resistance of the first resistor.

13. The voltage generator circuit as claimed in claim 11, wherein the control circuit comprises:

a second comparator comparing the stored voltage and the predetermined voltage to generate a compared signal; and a discharge circuit resetting the energy storage circuit according to the compared signal, wherein:
in response to the energy storage circuit receiving the charge current, the stored voltage is increased from an initial value, and
in response to the stored voltage reaching the predetermined voltage, the discharge circuit resets the energy storage circuit so that the stored voltage is equal to the initial value until the energy storage circuit receives the charge current.

14. The voltage generator circuit as claimed in claim 13, wherein in response to the energy storage circuit being charged by the charge current, the discharge circuit sets the control signal to a first level, and in response to the energy storage circuit being reset, the discharge circuit sets the control signal to a second level which is opposite to the first level.

15. The voltage generator circuit as claimed in claim 14, wherein the discharge circuit comprises:

a first logic gate comprising a first input terminal, a second input terminal, and a first output terminal, wherein the first input terminal receives the compared signal, and a level of the first output terminal serves as the control signal;

a second logic gate comprising a third input terminal, a fourth input terminal, and a second output terminal, wherein the third input terminal is coupled to the first output terminal, the fourth input terminal receives a reset signal, and the second output terminal is coupled to the second input terminal; and a discharge element discharging the stored voltage according to a level of the second output terminal.

16. The voltage generator circuit as claimed in claim 14, further comprising:

a buffer setting a level of the control signal according to a reference voltage.

17. The voltage generator circuit as claimed in claim 16, wherein a relationship between the counting voltage and the voltage difference is expressed using the following equation:

$$Y \propto \frac{K}{X}$$

wherein Y is the counting voltage, X is the voltage difference, and K relates to the reference voltage.

18. The voltage generator circuit as claimed in claim 11, wherein the second conversion circuit is a filter circuit.

19. The voltage generator circuit as claimed in claim 11, wherein the energy storage circuit comprises a capacitor, a voltage of the capacitor serves as the stored voltage, and a relationship between the counting voltage and the voltage difference is expressed using the following equation:

$$Y \propto \frac{K}{X}$$

wherein Y is the counting voltage, X is the voltage difference, and K relates to the capacitance of the capacitor.

* * * * *